(12) United States Patent
Momiuchi et al.

(10) Patent No.: US 10,720,459 B2
(45) Date of Patent: Jul. 21, 2020

(54) IMAGING ELEMENT PACKAGE AND CAMERA MODULE HAVING A SLIT FORMED IN AN ADHESIVE CONNECTING A FLEXIBLE SUBSTRATE AND ANOTHER MEMBER TO ADDRESS DIFFERENCES IN LINEAR EXPANSION COEFFICIENTS

(71) Applicant: SONY SEMICONDUCTOR SOLUTIONS CORPORATION, Kanagawa (JP)

(72) Inventors: Yuta Momiuchi, Kanagawa (JP); Yuji Takaoka, Kanagawa (JP); Hirokazu Nakayama, Kanagawa (JP); Kiyohisa Tanaka, Kanagawa (JP); Miyoshi Togawa, Oita (JP); Hirokazu Seki, Oita (JP); Eiichirou Kishida, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/319,393

(22) PCT Filed: Jul. 25, 2017

(86) PCT No.: PCT/JP2017/026767
§ 371 (c)(1),
(2) Date: Jan. 21, 2019

(87) PCT Pub. No.: WO2018/030139
PCT Pub. Date: Feb. 15, 2018

(65) Prior Publication Data
US 2019/0267418 A1 Aug. 29, 2019

(30) Foreign Application Priority Data
Aug. 8, 2016 (JP) .................................. 2016-155570

(51) Int. Cl.
*H04N 5/335* (2011.01)
*H01L 27/146* (2006.01)
(Continued)

(52) U.S. Cl.
CPC .... *H01L 27/14618* (2013.01); *H01L 23/5387* (2013.01); *H01L 27/146* (2013.01);
(Continued)

(58) Field of Classification Search
CPC .................................................. H01L 23/5387
See application file for complete search history.

(56) References Cited

U.S. PATENT DOCUMENTS 8,013,410 B2 * 9/2011 Imai .................. H01L 27/14618
257/432
9,287,317 B2 * 3/2016 Cha ......................... H01L 24/83
(Continued)

FOREIGN PATENT DOCUMENTS

JP 2002-009265 A 1/2002
JP 2011-146486 A 7/2011
(Continued)

OTHER PUBLICATIONS

International Search Report and Written Opinion of PCT Application No. PCT/JP2017/026767, dated Oct. 10, 2017, 09 pages of ISRWO.

*Primary Examiner* — Gary C Vieaux
(74) *Attorney, Agent, or Firm* — Chip Law Group

(57) ABSTRACT

The present technology relates to an imaging element package and a camera module capable of improving reliability. An imaging element package includes a flexible substrate, an imaging element connected to a first surface of the flexible substrate, and a member, bonded to a second surface of the flexible substrate opposite to the first surface with an adhesive, having a linear expansion coefficient different (Continued)

from the flexible substrate, in which in a portion of the adhesive, a slit is formed which intersects with a direction from the imaging element toward an end of the flexible substrate as viewed from a direction perpendicular to the flexible substrate. The present technology is applied to a camera module.

12 Claims, 11 Drawing Sheets

(51) Int. Cl.
*H01L 23/538* (2006.01)
*H04N 5/225* (2006.01)
*H04N 5/369* (2011.01)

(52) U.S. Cl.
CPC ..... *H01L 27/14627* (2013.01); *H04N 5/2252* (2013.01); *H04N 5/2253* (2013.01); *H04N 5/2254* (2013.01); *H04N 5/369* (2013.01); *H01L 27/14603* (2013.01)

(56) References Cited

U.S. PATENT DOCUMENTS

| 2011/0169118 A1 | 7/2011 | Sano |
| 2014/0048957 A1* | 2/2014 | Chung ............. H01L 23/49816 257/777 |

FOREIGN PATENT DOCUMENTS

| JP | 2011-159900 A | 8/2011 |
| JP | 2012-204390 A | 10/2012 |
| JP | 5794020 B2 | 10/2015 |

\* cited by examiner

IMAGING ELEMENT PACKAGE AND CAMERA MODULE HAVING A SLIT FORMED IN AN ADHESIVE CONNECTING A FLEXIBLE SUBSTRATE AND ANOTHER MEMBER TO ADDRESS DIFFERENCES IN LINEAR EXPANSION COEFFICIENTS

CROSS REFERENCE TO RELATED APPLICATIONS

This application is a U.S. National Phase of International Patent Application No. PCT/JP2017/026767 filed on Jul. 25, 2017, which claims priority benefit of Japanese Patent Application No. JP 2016-155570 filed in the Japan Patent Office on Aug. 8, 2016. Each of the above-referenced applications is hereby incorporated herein by reference in its entirety.

TECHNICAL FIELD

The present technology relates to an imaging element package and a camera module, and more particularly, to an imaging element package and a camera module capable of improving reliability.

BACKGROUND ART

In recent years, as mobile devices have been thinned, a request for reducing a height of an imaging element package and improving reliability has become stronger. As a response to the request, for example, a fanout imaging element package has been proposed in which an imaging element is connected to a circuit substrate including an opening and the opening is sealed with a transparent member such as glass (for example, refer to Patent Document 1).

In such an imaging element package, since an external terminal is provided on the outer side of the imaging element on the circuit substrate, the height of the imaging element package can be reduced although the size in a planar direction is larger than that of a fan-in imaging element package such as a Wafer Level Chip Size Package (WLCSP).

CITATION LIST

Patent Document

Patent Document 1: Japanese Patent No. 5794020

SUMMARY OF THE INVENTION

Problems to be Solved by the Invention

However, according to the technology described above, it has been difficult to sufficiently prevent occurrence of peeling of the circuit substrate, displacement of a connection position, and the like and to improve reliability.

For example, in the imaging element package, due to a difference between linear expansion coefficients of the circuit substrate connected to the imaging element and a transparent member bonded to the circuit substrate, the circuit substrate may be distorted when the imaging element package is heated. Then, due to the distortion of the circuit substrate, there is a possibility that an adhesive interface between the circuit substrate and the transparent member is peeled and positions of the imaging element and an external connection terminal are displaced. For example, if the position of the external connection terminal is displaced, secondary mounting reliability of the imaging element package deteriorates.

The present technology has been made in consideration of such a situation and can improve reliability.

Solutions to Problems

An imaging element package according to a first aspect of the present technology includes a flexible substrate, an imaging element connected to a first surface of the flexible substrate, and a member, bonded to a second surface of the flexible substrate opposite to the first surface with an adhesive, having a linear expansion coefficient different from the flexible substrate, in which in a portion of the adhesive, a slit is formed which intersects with a direction from the imaging element toward an end of the flexible substrate as viewed from a direction perpendicular to the flexible substrate.

The slit can be formed so that a width of the slit is wider than a thickness of the flexible substrate.

The slit can be formed in a region different from a region where a connection portion between the flexible substrate and the imaging element is provided as viewed from the direction perpendicular to the flexible substrate.

The slit can be formed in a region different from a region on the first surface in which an external terminal is provided as viewed from the direction perpendicular to the flexible substrate.

It is possible that the one or the plurality of slits is formed in the portion of the adhesive and that the slit is formed so that an optional straight line from the imaging element toward the end of the flexible substrate intersects with at least one of the one or the plurality of slits as viewed from the direction perpendicular to the flexible substrate.

The one or the plurality of slits surrounding a light receiving unit of the imaging element with no gap can be formed in the portion of the adhesive.

The slit can be formed in the portion of the adhesive so that the plurality of slits surrounds the light receiving unit of the imaging element.

It is possible that the imaging element is connected to the first surface so that the light receiving unit faces the member, an opening is provided in a portion of the flexible substrate facing the light receiving unit, and the member includes a transparent member.

A connection portion between the imaging element and the flexible substrate can be coated with resin.

It is possible that a hollow portion is provided between the light receiving unit of the imaging element and the member and that the one or the plurality of slits including the slit forms a ventilation path for connecting the hollow portion to an outside.

Only one end of the ventilation path on a side of the outside can be provided.

In the first aspect of the present technology, an imaging element package includes a flexible substrate, an imaging element connected to a first surface of the flexible substrate, and a member, bonded to a second surface of the flexible substrate opposite to the first surface with an adhesive, having a linear expansion coefficient different from the flexible substrate, in which in a portion of the adhesive, a slit is formed which intersects with a direction from the imaging element toward an end of the flexible substrate as viewed from a direction perpendicular to the flexible substrate.

A camera module according to a second aspect of the present technology includes a flexible substrate, an imaging element connected to a first surface of the flexible substrate, and a member, bonded to a second surface of the flexible substrate opposite to the first surface with an adhesive, having a linear expansion coefficient different from the flexible substrate, a lens which guides light entered from outside to the imaging element via the member and an opening of the flexible substrate, and a substrate connected to the first surface of the flexible substrate, in which in a portion of the adhesive, a slit is formed which intersects with a direction from the imaging element toward an end of the flexible substrate as viewed from a direction perpendicular to the flexible substrate.

In a second aspect of the present technology, a camera module includes a flexible substrate, an imaging element connected to a first surface of the flexible substrate, a member, bonded to a second surface of the flexible substrate opposite to the first surface with an adhesive, having a linear expansion coefficient different from the flexible substrate, a lens which guides light entered from outside to the imaging element via the member and an opening of the flexible substrate, and a substrate connected to the first surface of the flexible substrate, in which in a portion of the adhesive, a slit is formed which intersects with a direction from the imaging element toward an end of the flexible substrate as viewed from a direction perpendicular to the flexible substrate.

Effects of the Invention

According to the first and second aspects of the present technology, reliability can be improved.

MODE FOR CARRYING OUT THE INVENTION

Hereinafter, embodiments to which the present technology has been applied will be described with reference to the drawings.

First Embodiment

<Exemplary Configuration of Camera Module>
According to the present technology, it is possible to prevent occurrence of distortion of a flexible substrate and improve reliability by providing a slit in an adhesive portion for bonding the flexible substrate connected to an imaging element and a transparent member so as to surround an imaging element portion.

Note that, the term "to surround an imaging element portion by a slit" includes not only a case where the imaging element is surrounded by the slit with no gap, but also a case where the imaging element is surrounded by the plurality of slits formed to have gaps provided between the slits, a case where the imaging element is not completely, but substantially surrounded by one slit, and the like.

Hereinafter, especially, when there is no specific description such as "surrounded with no gap" and "substantially surrounded" and it is simply described that the imaging element portion is surrounded by the slit, a case where the imaging element is surrounded by the slit with no gap, a case where the imaging element is substantially surrounded by the plurality of slits, a case where the imaging element is not completely, but substantially surrounded by one slit, and the like are included.

The present technology can be applied to, for example, an imaging element package including an imaging element, a camera module including such an imaging element package, and the like. Furthermore, for example, the camera module to which the present technology has been applied can be used for an in-vehicle camera and a medical camera, a monitoring camera, a camera mounted on a mobile device or a personal computer, and the like.

Figure 1:
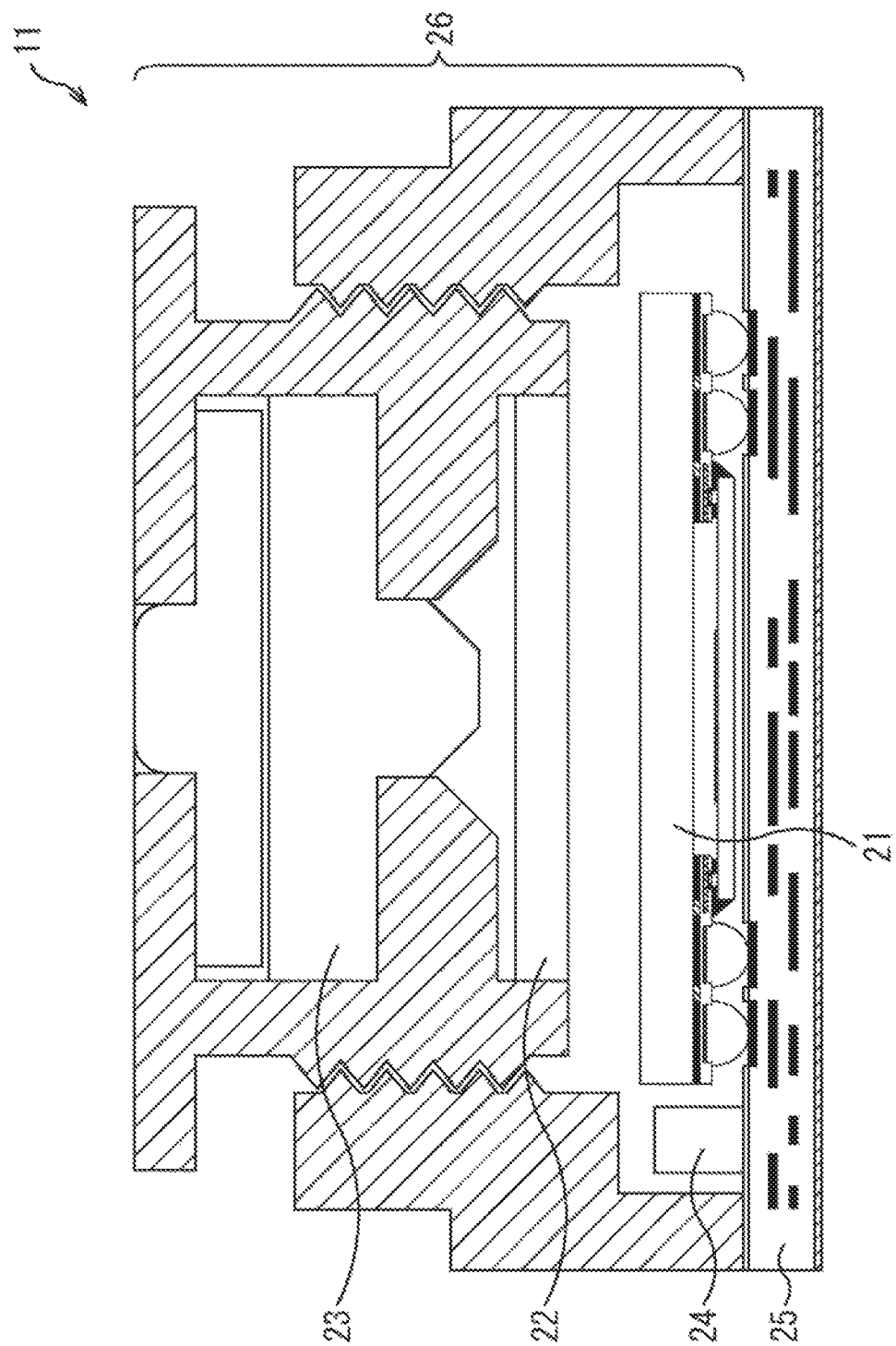
FIG. 1 is a diagram of an exemplary configuration of a camera module.

FIG. 1 is a diagram of an exemplary configuration of an embodiment of the camera module to which the present technology has been applied.

A camera module 11 illustrated in FIG. 1 includes an imaging element package 21, a functional glass member 22, an optical lens 23, a passive device 24, and a substrate 25.

In this example, the imaging element package 21, the functional glass member 22, the optical lens 23, and the passive device 24 are arranged in a housing 26 of the camera module 11. In particular, in this example, a lens module including the functional glass member 22 and the optical lens 23 is attached to the housing 26.

Furthermore, in the camera module 11, the imaging element package 21 and the passive device 24 are mounted (connected) on the substrate 25 which is a motherboard of the camera module 11.

The imaging element package 21 includes, for example, an imaging element such as a Complementary Metal Oxide Semiconductor (CMOS) image sensor and is a package to realize an imaging function. The imaging element package 21 is physically connected to the substrate 25, and this electrically connects the imaging element package 21 to the inside of the substrate 25.

The functional glass member 22 which functions as an infrared cut filter and the like is arranged on the upper side in the drawing of the imaging element package 21, and in addition, the optical lens 23 which collects light from outside and guides the light to the imaging element package 21 is arranged on the upper side of the drawing of the functional glass member 22.

Therefore, at the time of imaging, light from a subject is collected by the optical lens 23, passes through the functional glass member 22, and enters a light receiving unit of the imaging element package 21. The imaging element package 21 images an image by receiving the entered light and photoelectrically converting the received light, and outputs data of the obtained image to the substrate 25.

Furthermore, the passive device 24 includes, for example, an element such as a chip capacitor and is electrically connected to the inside of the substrate 25 by being connected on the substrate 25.

<Exemplary Configuration of Imaging Element Package>

Next, a detailed exemplary configuration of the imaging element package 21 illustrated in FIG. 1 will be described.

Figure 2:
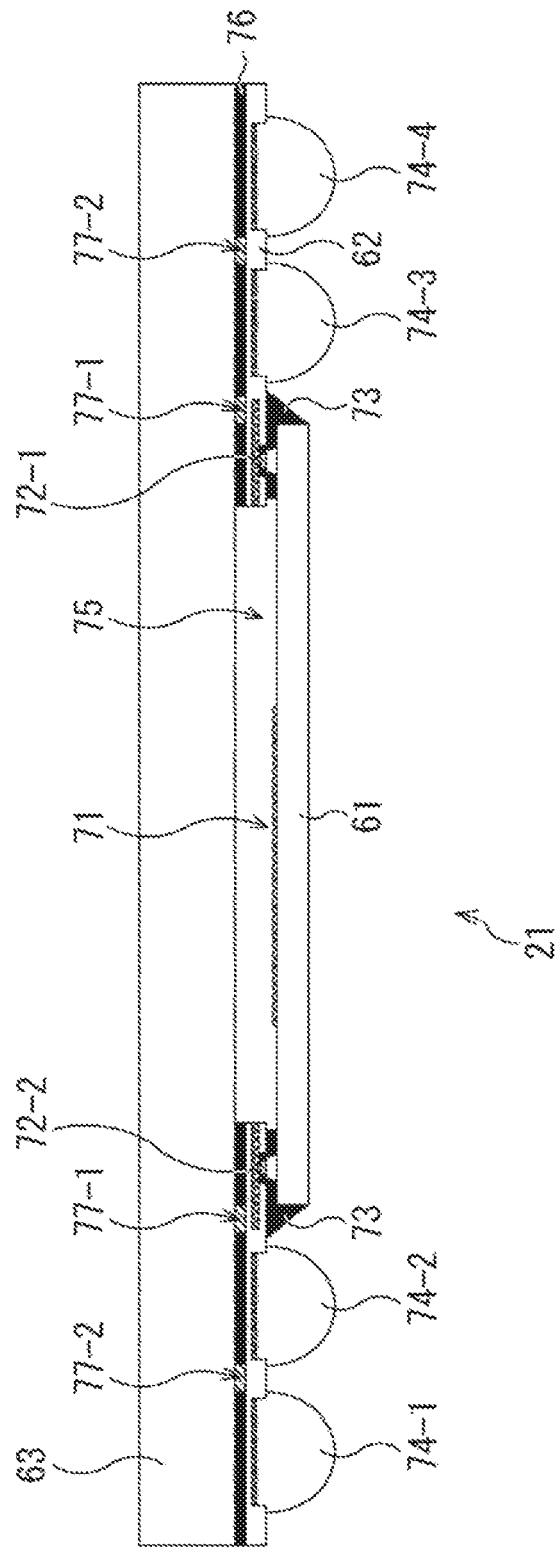
FIG. 2 is a diagram of an exemplary configuration of an imaging element package.

The imaging element package 21 is a fanout package (semiconductor device) including an imaging element, and a cross section of the imaging element package 21 is as illustrated in FIG. 2, for example.

In the example illustrated in FIG. 2, the imaging element package 21 includes an imaging element 61, a flexible substrate 62, and a transparent member 63.

The imaging element 61 includes, for example, a CMOS image sensor or the like, and includes a plurality of pixels. Each pixel generates a signal according to a receiving amount of incident light by receiving light from outside and photoelectrically converting the light. The imaging element 61 is connected to the flexible substrate 62 by conductive bumps 72-1 and 72-2 so that a light receiving unit 71 including the plurality of pixels faces the flexible substrate 62. That is, the conductive bumps 72-1 and 72-2 are formed at an input terminal of the imaging element 61, and the imaging element 61 is flip-chip connected to a lower surface of the flexible substrate 62 in FIG. 2 by the conductive bumps 72-1 and 72-2.

Note that, in a case where it is not especially necessary to distinguish the conductive bumps 72-1 and 72-2, the conductive bumps 72-1 and 72-2 are simply referred to as a conductive bump 72 below.

Here, the conductive bump 72 includes, for example, a gold stud bump, conductive paste, and the like, and the conductive bump 72 physically and electrically connects the imaging element 61 to the flexible substrate 62. Note that, the material of the conductive bump 72 is not limited to the gold stud bump and the conductive paste, and the conductive bump 72 may include any material as long as the material can connect the imaging element 61 to the flexible substrate 62.

Furthermore, a connection portion between the imaging element 61 and the flexible substrate 62, that is, a portion of the conductive bump 72 is coated with a resin 73 from a side of the imaging element 61 to secure connection strength, and a space between the imaging element 61 and the transparent member 63 is sealed with the resin 73 with no gap.

Furthermore, on the surface of the flexible substrate 62 where the imaging element 61 is mounted, external terminals 74-1 to 74-4 to be connected to the substrate 25 which is a motherboard are formed. In this example, the external terminals 74-1 to 74-4 are provided in a region near an outer periphery of the imaging element 61 of the flexible substrate 62, and the flexible substrate 62 is physically and electrically connected to the substrate 25 by these external terminals 74-1 to 74-4.

Note that, in a case where it is not especially necessary to distinguish the external terminals 74-1 to 74-4 from each other, the external terminals 74-1 to 74-4 are simply referred to as an external terminal 74 below. The external terminal 74 includes, for example, a solder ball or the like. However, the external terminal 74 may include any material as long as the material can connect the flexible substrate 62 to the substrate 25.

Furthermore, an opening 75 is provided in a portion of the flexible substrate 62 facing the light receiving unit 71 of the imaging element 61. In this example, the opening 75 is a region larger than the light receiving unit 71, and the light entered from outside (subject) via the optical lens 23, the functional glass member 22, and the transparent member 63 passes through the opening 75 and enters the light receiving unit 71.

Note that it is desirable that the opening 75 be a region larger than the light receiving unit 71. However, it is not necessarily for the opening 75 to be the region larger than the light receiving unit 71 as long as the opening 75 can sufficiently guide the light from outside to the light receiving unit 71.

To a surface of the flexible substrate 62 opposite to the surface connected to the imaging element 61 and the external terminals 74, the plate-like transparent member 63 is bonded with an adhesive 76 so as to close the opening 75. In other words, in this example, the transparent member 63 is bonded to the surface of the flexible substrate 62 on the side of the functional glass member 22 so that the light receiving unit 71 of the imaging element 61 faces the transparent member 63. Such a transparent member 63 is a member having a linear expansion coefficient different from that of the flexible substrate 62.

The transparent member 63 includes cover glass including, for example, plate-like transparent glass, a plate-like transparent infrared cut filter, and the like. However, any material may be used as long as the member transmits light in a wavelength band to be entered the light receiving unit 71. Note that, when the transparent member 63 includes an infrared cut filter, the transparent member 63 can have an effect of removing infrared light.

In the imaging element package 21, the opening 75 is covered with the transparent member 63, and the connection portion between the imaging element 61 and the flexible substrate 62 is covered with the resin 73 with no gap.

Therefore, a space in the opening 75 where the light receiving unit 71 is arranged, that is, a space surrounded by the transparent member 63 and the imaging element 61 (referred to as hollow portion below) is sealed with no gap. By sealing the hollow portion by the transparent member 63 and the resin 73 in this way, it is possible to prevent foreign matters from mixing from outside and being attached to the pixel of the light receiving unit 71.

Furthermore, the adhesive 76 for bonding the flexible substrate 62 to the transparent member 63 includes, for example, resin, a tape, and the like for die bonding. However, other than that, any material may be used as long as the material can bond the flexible substrate 62 to the transparent member 63.

In addition, in the portion of the adhesive 76, slits 77-1 and 77-2 are formed so as to surround the light receiving unit 71 of the imaging element 61 when the imaging element package 21 is viewed from a direction perpendicular to the flexible substrate 62, that is, so as to surround the opening 75.

Here, the direction perpendicular to the flexible substrate 62 is a vertical direction in FIG. 2, that is, a direction perpendicular to a surface of the flexible substrate 62 where the imaging element 61 is mounted. Furthermore, in a case where it is not especially necessary to distinguish the slits 77-1 and 77-2 from each other, the slits 77-1 and 77-2 are simply referred to as a slit 77 below.

In this example, the two slits 77 surround the portion of the imaging element 61 with no gap. However, it is preferable to form at least one slit 77. Furthermore, here, an example will be described in which the imaging element 61 is surrounded by the slits 77 with no gap. However, it is preferable to provide the slits so as to roughly surround the imaging element 61. Therefore, for example, a plurality of slits may be provided in a portion of the adhesive 76 so that the imaging element 61 is surrounded by the plurality of slits, and one slit which roughly surrounds the imaging element 61 may be provided.

Furthermore, to secure connectivity between the conductive bump 72 which is a connection portion of the imaging element 61 and the external terminal 74 to the flexible substrate 62, it is preferable that the slit 77 be not formed immediately above the conductive bump 72 and the external terminal 74 in the portion of the adhesive 76.

In this example, when viewed from the direction perpendicular to the flexible substrate 62, that is, a normal direction of the surface of the flexible substrate 62 where the imaging element 61 is mounted, the slit 77 is not provided in region portions which are provided at the same positions as the conductive bump 72 and the external terminal 74 in the adhesive 76.

In other words, the slit 77 is formed in a region different from a region where the conductive bump 72 and the external terminal 74 are provided as viewed from the direction perpendicular to the flexible substrate 62. That is, the conductive bump 72 and the external terminal 74 are provided immediately below a portion, where the slit 77 is not provided and which is covered with the adhesive 76, of the flexible substrate 62.

Therefore, when the imaging element 61 is flip-chip connected to the flexible substrate 62, the slit 77 is not formed in a portion of the flexible substrate 62 where the conductive bump 72 is directly pressed, that is, a portion immediately below the conductive bump 72. Therefore, pressure at the time of crimping the imaging element 61 is not dispersed by the slit 77. Therefore, it is possible to prevent deterioration in the connectivity of the imaging element 61. Similar to a case of the portion of the conductive bump 72, it is possible to prevent deterioration in the connectivity of the portion of the external terminal 74 when the imaging element package 21 is connected to the substrate 25.

Furthermore, even when heat is applied to the imaging element package 21, the portions of the conductive bump 72 and the external terminal 74 of the flexible substrate 62 are not distorted. Therefore, for example, a connection failure caused by a load applied to the portions of the conductive bump 72 and the external terminal 74 does not occur, and the connectivity with the flexible substrate 62 can be secured. As a result, the reliability of the imaging element package 21 can be improved.

Note that, here, an example will be described in which connection portions such as the conductive bump 72 and the external terminal 74 are not provided immediately below the slit 77. However, the conductive bump 72 and the external terminal 74 may be provided immediately below the slit 77.

Furthermore, in FIG. 2, an example has been described in which the transparent member 63 is directly bonded to the flexible substrate 62. However, another member may be provided between the flexible substrate 62 and the transparent member 63, more particularly, between the adhesive 76 and the transparent member 63.

As such an example, an example can be considered in which a light shielding member (light shielding layer) having an opening similar to the opening 75 is provided, for example, between the adhesive 76 and the transparent member 63. In this case, the flexible substrate 62 is bonded to the light shielding member with the adhesive 76, and in addition, the transparent member 63 is bonded to the light shielding member, for example. By providing the light shielding member between the transparent member 63 and the flexible substrate 62 in this way, stray light can be prevented from entering the light receiving unit 71.

Figure 3:
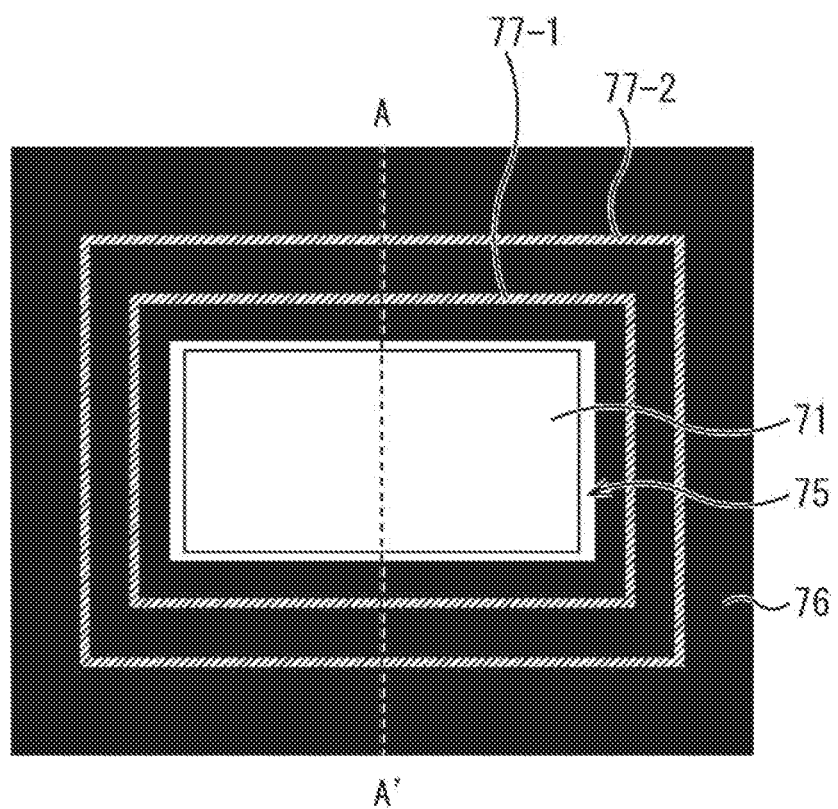
FIG. 3 is a diagram for explaining a slit.

Furthermore, when a portion of the slit 77 of the imaging element package 21 illustrated in FIG. 2 is viewed from the upper side toward the lower side in FIG. 2, that is, viewed from the direction perpendicular to the flexible substrate 62, the portion of the slit 77 is as illustrated in FIG. 3. Note that parts in FIG. 3 corresponding to those in a case in FIG. 2 are denoted with the same reference numerals, and description thereof will be appropriately omitted.

FIG. 3 is a top view of the portion of the slit 77 viewed from the direction perpendicular to the flexible substrate 62, and a cross-sectional diagram taken along a line A-A' illustrated in FIG. 3 is the cross-sectional diagram illustrated in FIG. 2.

In the example in FIG. 3, the light receiving unit 71 of the imaging element 61 is arranged in a substantially center portion of the flexible substrate 62, and the rectangular frame-shaped slit 77 is formed in a portion of the adhesive 76 so as to surround the light receiving unit 71 of the imaging element 61 with no gap.

In other words, a slit, which is long in a direction intersecting with a direction from the light receiving unit 71 arranged in the center portion toward the outer side (end) of the flexible substrate 62 (imaging element package 21) when the flexible substrate 62 is viewed from the perpendicular direction, is formed as the slit 77. That is, in the example illustrated in FIG. 3, an optional straight line from the light receiving unit 71 of the imaging element 61 toward the end (outer peripheral end) of the flexible substrate 62 certainly intersects with the slit 77.

In this way, in the camera module 11, by providing the slit 77 which intersects with the direction from the imaging element 61 toward the end of the flexible substrate 62, it is possible to prevent distortion of the flexible substrate 62 and improve the reliability.

Specifically, for example, heat is applied to the imaging element package 21 when the external terminal 74 is formed, when the imaging element package 21 is connected to the substrate 25, and the like.

When heat is applied to the imaging element package 21 in this way, the flexible substrate 62 and the transparent member 63 included in the imaging element package 21 are thermally expanded in a direction from the center of the flexible substrate 62 toward the outer periphery (end) when the flexible substrate 62 is viewed from the perpendicular direction.

At this time, since the linear expansion coefficients of the flexible substrate 62 and the transparent member 63 are different from each other, stress (load) is applied to the flexible substrate 62, and there is a possibility that the flexible substrate 62 is distorted. When the flexible substrate 62 is distorted, peeling of an interface portion of the adhesive 76, displacement of the external terminal 74, and displacement of the imaging element 61, for example, may occur. For example, when the displacement of the external terminal 74 occurs, the imaging element package 21 is connected to the substrate 25 in a state where the position of the external terminal 74 on the flexible substrate 62 is displaced from the connection position on the substrate 25. Therefore, secondary mounting reliability deteriorates.

Therefore, in the camera module 11, by providing the slit 77 intersecting with the direction in which the load is applied to the flexible substrate 62 at the time of heating, that is, the direction of the thermal expansion, the distortion of the flexible substrate 62 is absorbed by the slit 77. That is, the distortion is relaxed by the slit 77.

Figure 4:
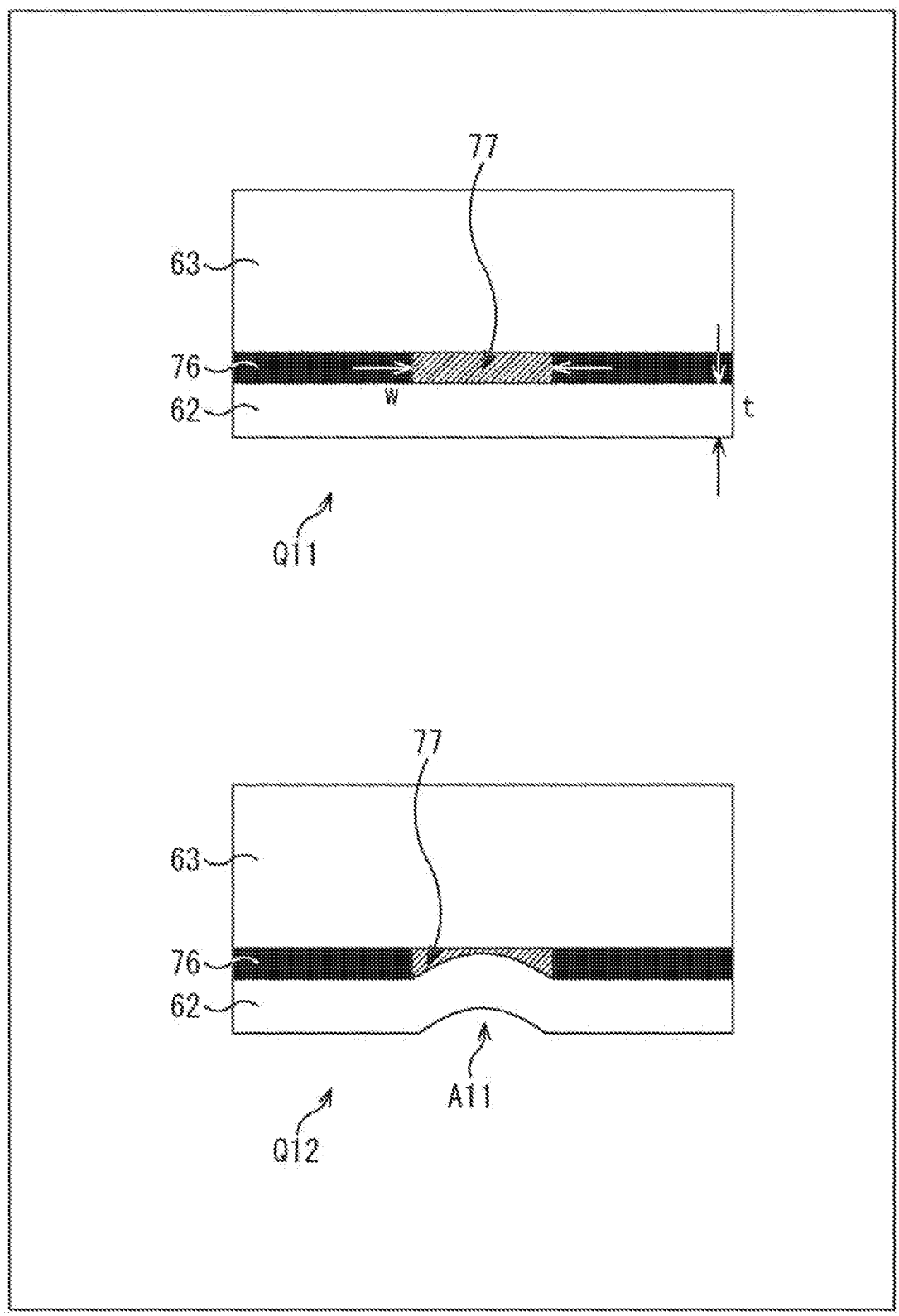
FIG. 4 is a diagram for explaining prevention of distortion caused by the slit.

For example, as illustrated in FIG. 4, attention is paid to the one slit 77. Note that parts in FIG. 4 corresponding to those in a case in FIG. 2 are denoted with the same reference numerals, and description thereof will be appropriately omitted.

In FIG. 4, an enlarged portion near the slit 77 illustrated in FIG. 2 is illustrated. In particular, in this example, a diagram is illustrated in which the portion of the slit 77 is viewed from the direction same as that in FIG. 2. Therefore, in FIG. 4, the lateral direction is the direction of the thermal expansion of the flexible substrate 62.

As indicated by an arrow Q11, the transparent member 63 is bonded to the flexible substrate 62 with the adhesive 76, and the slit 77 is formed in the portion of the adhesive 76.

Then, when the imaging element package 21 is heated, the flexible substrate 62 and the transparent member 63 are expanded in the lateral direction in FIG. 4 as indicated by an arrow Q12. At this time, although the flexible substrate 62 is distorted by a difference between the linear expansion coefficients of the flexible substrate 62 and the transparent member 63, the distortion is absorbed by the slit 77 as indicated by an arrow A11.

In other words, although small distortion occurs in the portion of the slit 77, distortion in a portion other than the slit 77 can be prevented. Therefore, in the entire flexible substrate 62, the distortion caused by the thermal expansion is relaxed. In other words, although the small distortion locally occurs in the portion of the slit 77, in the entire flexible substrate 62, that is, almost no distortion occurs from a big perspective, the distortion can be prevented by the slit 77.

In this case, a portion in the flexible substrate 62 other than the portion adjacent to the slit 77 is not distorted. As described above, since the conductive bump 72 and the external terminal 74 are not provided immediately below the slit 77 in the flexible substrate 62, the portions of the conductive bump 72 and the external terminal 74 are not distorted. With this configuration, the connectivity between the flexible substrate 62, and the conductive bump 72 and the external terminal 74 can be secured.

Note that, to relax the distortion of the flexible substrate 62, as indicated by the arrow Q11, it is desirable that the slit 77 be formed with a width w of the slit 77 larger (wider) than a thickness t of the flexible substrate 62.

Here, the width w of the slit 77 is the lateral direction in FIG. 4, that is, a direction from the center of the flexible substrate 62 toward the outer periphery (end), and is a width of the slit 77 in the short length direction. In other words, the width w is a thickness of the slit 77 when the slit 77 is viewed from the direction perpendicular to the flexible substrate 62.

In addition, the thickness t of the flexible substrate 62 is a thickness in the vertical direction in FIG. 4 which is the direction perpendicular to the flexible substrate 62. By forming the slit 77 with the width w wider than the thickness t in this way, the distortion of the flexible substrate 62 is easily absorbed by the slit 77.

As described above, by providing the slit 77 intersecting with the direction from the center of the flexible substrate 62 toward the outer periphery when the flexible substrate 62 is viewed from the perpendicular direction, the distortion of the flexible substrate 62 caused by the linear expansion coefficient difference from the transparent member 63 can be prevented.

This can reduce an occurrence risk of the peeling of the flexible substrate 62 from the transparent member 63, displacement of the mounting position of the external terminal 74, displacement of the connection position of the imaging element 61, and the like, and the imaging element package 21 with a low height, that is, thin, and with high reliability can be provided.

<Manufacture of Imaging Element Package>

Next, with reference to FIGS. 5 and 6, an example of a manufacturing flow of the imaging element package described above will be described.

Figure 5:
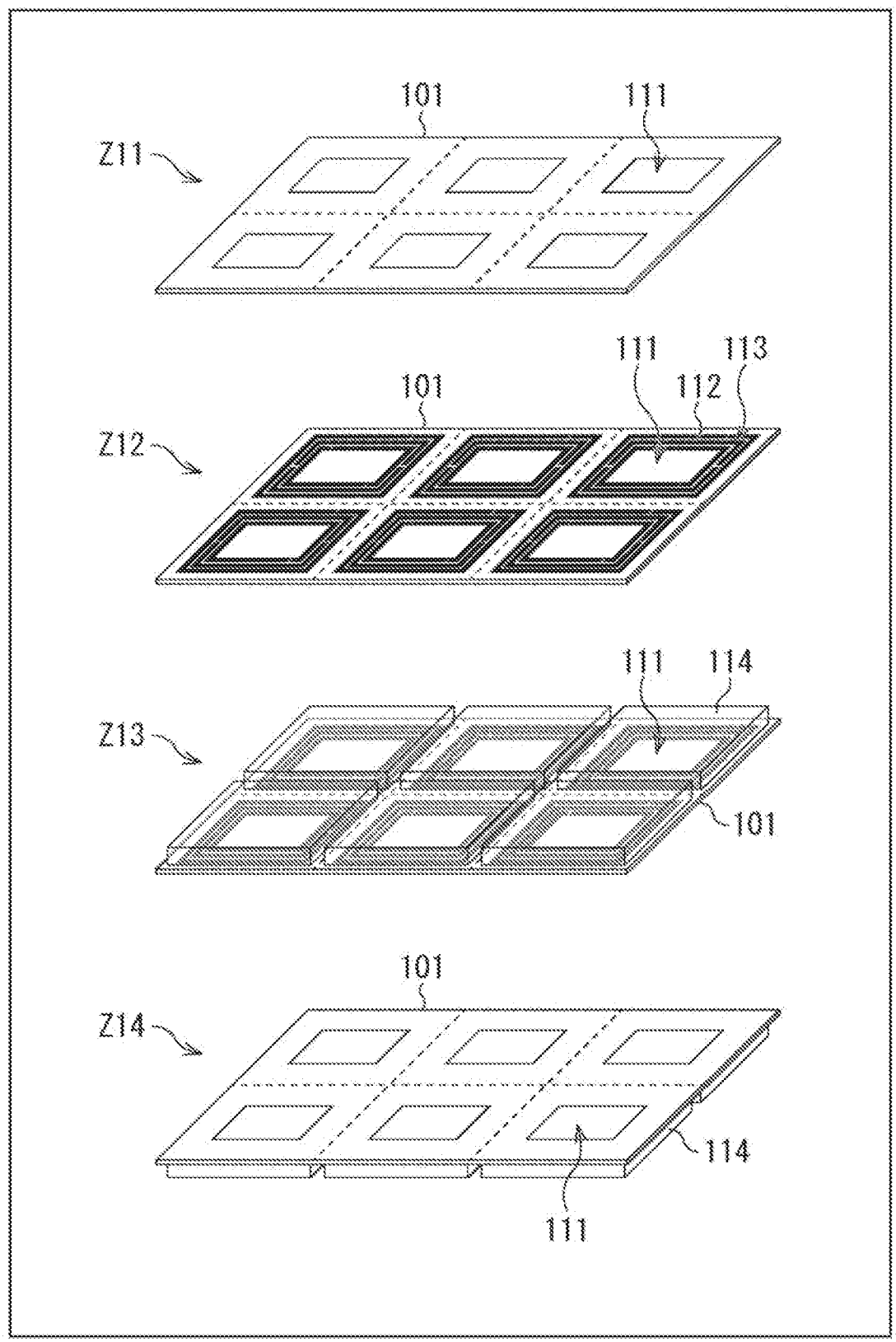
FIG. 5 is a diagram for explaining manufacture of the imaging element package.
Figure 6:
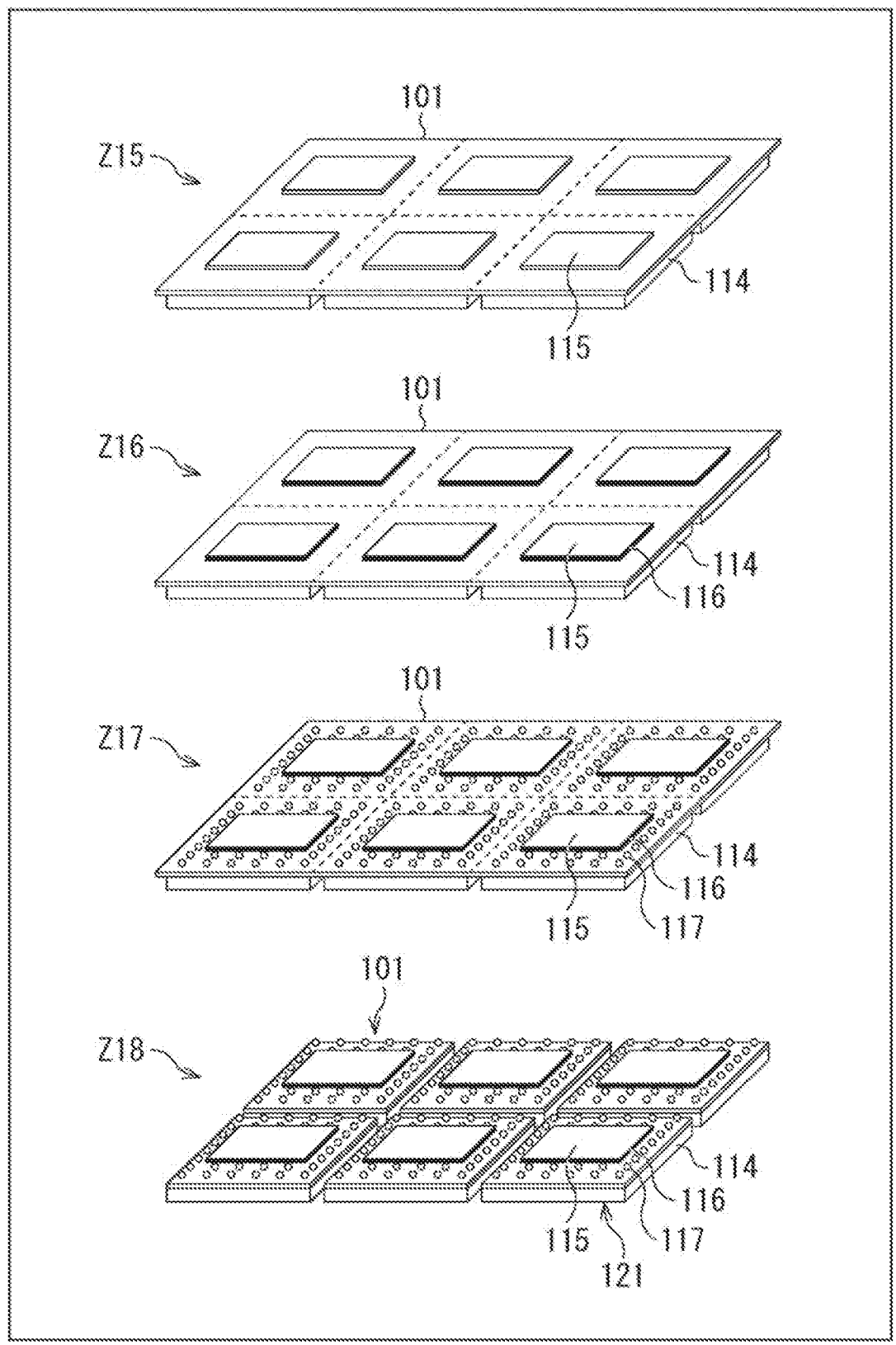
FIG. 6 is a diagram for explaining the manufacture of the imaging element package.

At the time of manufacturing the imaging element package, for example, as indicated by an arrow Z11 in FIG. 5, a sheet-shaped (plate-like) assembly 101 including a plurality of flexible substrates corresponding to the flexible substrate 62 illustrated in FIG. 2 is prepared. In the assembly 101, a plurality of openings including an opening 111 is provided, and for example, the opening 111 corresponds to the opening 75 illustrated in FIG. 2.

Next, as indicated by an arrow Z12, adhesive is patterned in an outer peripheral portion of each opening in the assembly 101. For example, as a patterning method, a method of using a jet dispenser, or the like is considered. Furthermore, in a case where the adhesive is photosensitive resin, photolithography and the like can be considered as the patterning method.

When the adhesive is patterned, a slit is formed in the adhesive portion. For example, in this example, the outer peripheral portion of the opening 111 is coated with adhesive 112, and a plurality of slits including a slit 113 is formed in a partial region of the adhesive 112 so as to surround the opening 111. Here, the adhesive 112 corresponds to the adhesive 76 in FIG. 2, and the slit 113 corresponds to the slit 77 in FIG. 2.

When patterning is performed, each transparent member including glass, an infrared cut filter, and the like is bonded (fixed) to the assembly 101 so as to cover each opening of the assembly 101 as indicated by an arrow Z13. In this example, for example, one transparent member 114 is bonded to the assembly 101 with the adhesive 112 so as to cover a portion of the opening 111. The transparent member 114, for example, corresponds to the transparent member 63 in FIG. 2.

When the assembly 101 to which the transparent member is bonded in this way is viewed from a side opposite to the side to which the transparent member is fixed, a space surrounded by the transparent member and the opening is generated, for example, as indicated by an arrow Z14. This space is a region to be the hollow portion described above when the imaging element is mounted.

Subsequently, as indicated by an arrow Z15 in FIG. 6, a portion of each opening on a surface opposite to the side of the assembly 101 where the transparent member is bonded is flip-chip connected to the imaging element so as to cover each opening.

In this example, for example, an imaging element 115 is connected to the surface of the assembly 101 opposite to surface on the side of the transparent member 114. The imaging element 115 corresponds to the imaging element 61 in FIG. 2, a conductive bump corresponding to the conductive bump 72 illustrated in FIG. 2 is formed on the imaging element 115 at the time of flip-chip mounting, and the imaging element 115 is connected to the assembly 101 by the conductive bump.

Thereafter, as indicated by an arrow Z16, resin for securing the strength is applied to the connection portion between each imaging element and the assembly 101. For example, in this example, the connection portion of the imaging element 115 is coated with resin 116, and the hollow portion between the imaging element 115 and the transparent member 114 is sealed. The resin 116 corresponds to the resin 73 illustrated in FIG. 2, for example.

In addition, a plurality of external terminals is formed in a region of an outer peripheral portion of each imaging element on the assembly 101 as indicated by an arrow Z17. In this example, for example, the plurality of external terminals including an external terminal 117 is formed in the region around the imaging element 115 in the assembly 101 so as to surround the imaging element 115. For example, the external terminal 117 corresponds to the external terminal 74 illustrated in FIG. 2.

In a manufacturing process of the imaging element package, heat is applied to the assembly 101 when the plurality of external terminals such as the external terminal 117 is formed in the outer peripheral portion of the imaging element in the assembly 101 as indicated by the arrow Z17. At this time, for example, by forming the slit such as the slit 113 in the adhesive portion as indicated by the arrow Z12 in FIG. 5, it is possible to prevent the distortion of the flexible substrate and to prevent the peeling of the interface portion of the adhesive, the displacement of the external terminal and the imaging element, and the like.

Finally, as indicated by an arrow Z18, the assembly 101 is divided, and the manufacturing process of the imaging element package is completed. That is, the assembly 101 is divided into the plurality of imaging element packages. In this example, for example, a portion including the imaging element 115 obtained by division is one imaging element package 121 corresponding to the imaging element package 21 in FIG. 2.

Note that, the manufacturing process of the imaging element package described above is merely an example, and the imaging element package may be manufactured by any method.

Second Embodiment

<Exemplary Formation of Slit>

Furthermore, in the above, as an example of the slit formed around the imaging element 61 of the imaging element package 21 as illustrated in FIG. 3, a case has been described in which the rectangular frame-shaped slit 77 surrounding the imaging element 61 with no gap is formed in the portion of the adhesive 76.

However, the slit is not limited to this, and any slit may be used as long as the slit intersects with the direction from the imaging element 61 toward the outer peripheral end of the flexible substrate 62 when the flexible substrate 62 is viewed from the perpendicular direction.

Figure 7:
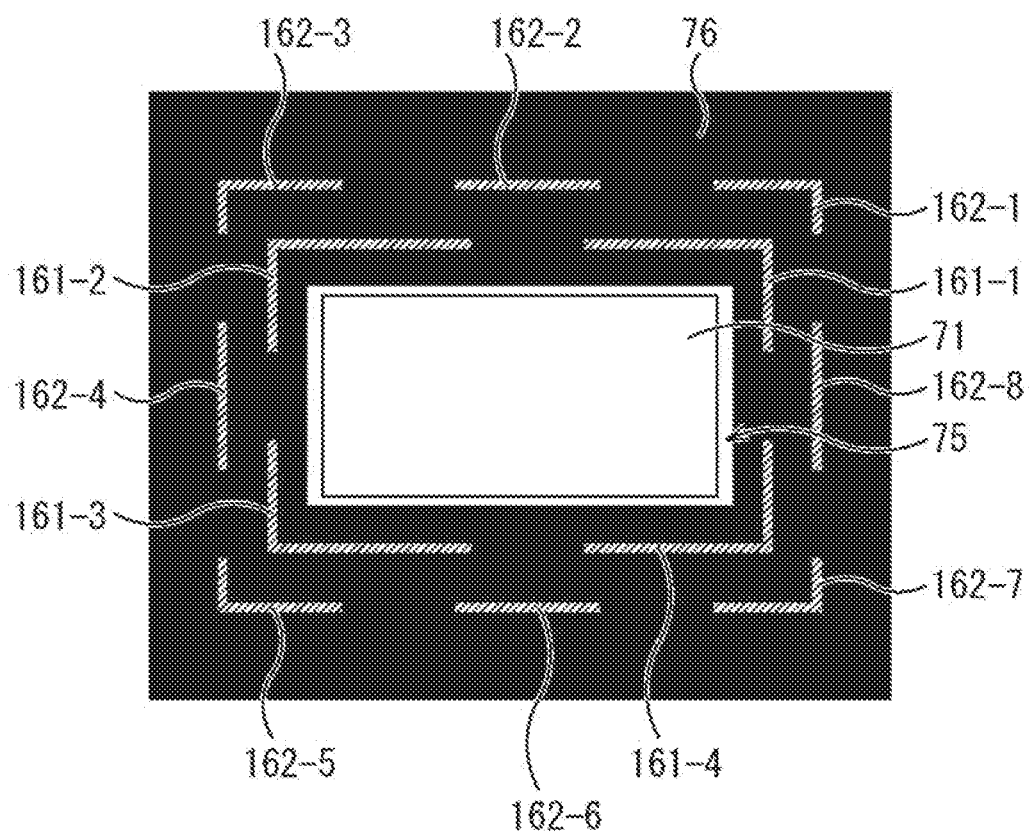
FIG. 7 is a diagram for explaining another example of slits.

For example, as illustrated in FIG. 7, the plurality of slits may be formed in the portion of the adhesive 76 so that the imaging element 61 is surrounded by the plurality of slits arranged to have gaps therebetween. Note that parts in FIG. 7 corresponding to those in a case in FIG. 3 are denoted with the same reference numerals, and description thereof will be appropriately omitted. Furthermore, similar to the case of FIG. 3, FIG. 7 is a diagram of the portion of the adhesive 76 when viewed from the direction perpendicular to the surface of the flexible substrate 62 to which the imaging element 61 is connected.

In this example, in the portion of the adhesive 76, a plurality of slits 161-1 to 161-4 and 162-1 to 162-8 is formed in a region of an outer peripheral portion of a light receiving unit 71 of the imaging element 61.

Note that, hereinafter, in a case where it is not necessary to particularly distinguish the slits 161-1 to 161-4 from each other, the slits are simply referred to as a slit 161, and in a case where it is not necessary to particularly distinguish the slits 162-1 to 162-8 from each other, the slits are simply referred to as a slit 162.

In the example illustrated in FIG. 7, the four slits 161 are formed so that the L-shaped slits 161-1 to 161-4 surround the light receiving unit 71.

Similarly, the eight slits 162 are formed so that the L-shaped or linear slits 162-1 to 162-8 surround the light receiving unit 71.

Here, although the light receiving unit 71 is surrounded by the four slits 161, in more detail, gaps, that is, portions of the adhesive 76 are provided between the slits 161, the light receiving unit 71 is not completely surrounded by the slits 161. That is, the slits 161 surrounding the light receiving unit 71 are partially interrupted. Similarly, although the light receiving unit 71 is surrounded by the eight slits 162, in more detail, gaps are provided between the slits 162, and the light receiving unit 71 (imaging element 61) is not completely surrounded by the slits 162.

However, when viewing the flexible substrate 62 from the perpendicular direction, these slits 161 and 162 intersect with the direction from the imaging element 61 arranged in the center portion toward the end of the flexible substrate 62. Therefore, by providing the slits 161 and 162, a similar effect to the slit 77 illustrated in FIG. 3 can be realized.

Particularly, although there are gaps between the slits 161 and the slits 162, when an optional straight line (vector) from the center of the light receiving unit 71 toward the end of the flexible substrate 62 when the flexible substrate 62 is viewed from the perpendicular direction is considered, the straight line necessarily intersects with at least one of the slits 161 or 162. Therefore, regardless of the degree of the thermal expansion of the flexible substrate 62, the distortion can be prevented by the slits 161 and 162.

Third Embodiment

<Exemplary Formation of Slit>

As described above, the hollow portion is formed between the imaging element 61 and the transparent member 63 in the imaging element package 21, and the hollow portion is filled with air.

Not only in the imaging element package 21 but also in a general imaging element package, to prevent adhesion of foreign matters to a light receiving unit of an imaging element, an opening of a flexible substrate is often completely sealed with a transparent member. Therefore, heat generated in the manufacturing process increases a pressure in the hollow portion formed between the imaging element and the transparent member.

There is a possibility that such an increase in the internal pressure of the hollow portion causes warpage of the imaging element package, breakage of an interface of the adhesive, and the like.

Therefore, it is possible to relax the increase in the internal pressure of the hollow portion and improve reliability by providing a ventilation path, which connects the hollow portion to the outside of the imaging element package, in the adhesive portion.

Figure 8:
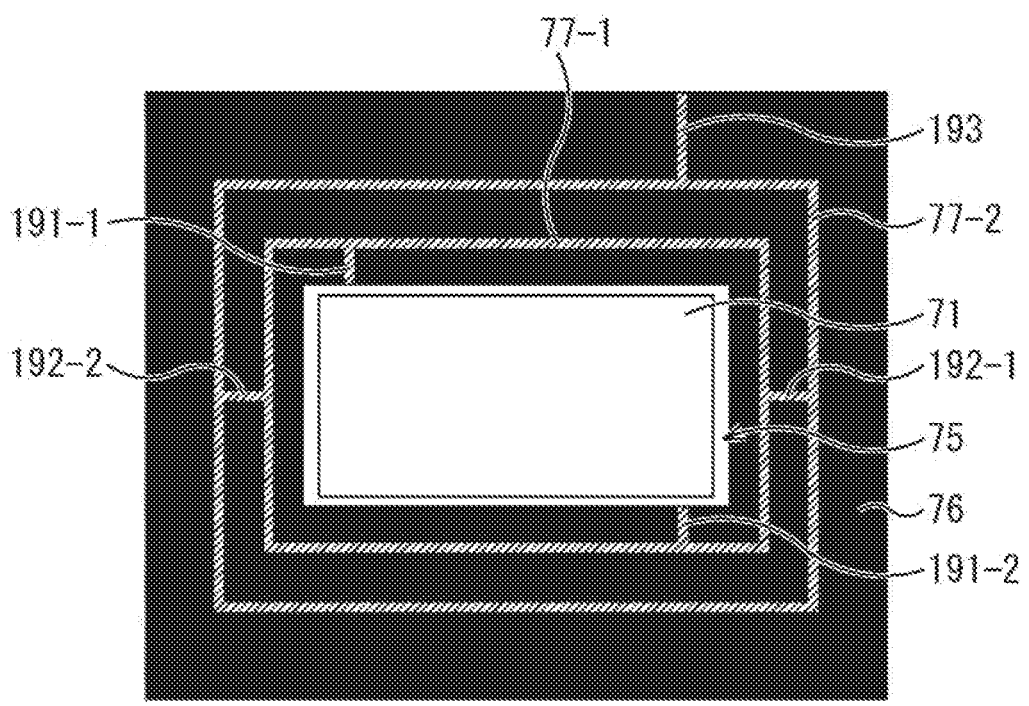
FIG. 8 is a diagram for explaining still another example of slits.

In such a case, the portion of the adhesive 76 in the imaging element package 21 is, for example, formed as illustrated in FIG. 8. Note that parts in FIG. 8 corresponding to those in a case in FIG. 3 are denoted with the same reference numerals, and description thereof will be appropriately omitted. Furthermore, similar to the case of FIG. 3, FIG. 8 is a diagram of the portion of the adhesive 76 when viewed from the direction perpendicular to the surface of the flexible substrate 62 to which the imaging element 61 is connected.

In the example illustrated in FIG. 8, in the outer peripheral portion of the light receiving unit 71 of the imaging element 61 in the portion of the adhesive 76, slits 191-1, 191-2, 192-1, 192-2, and 193 are formed in addition to the slits 77-1 and 77-2 illustrated in FIG. 3. Note that, hereinafter, in a case where it is not necessary to particularly distinguish the slits 191-1 and 191-2 from each other, the slits are simply referred to as a slit 191, and in a case where it is not necessary to particularly distinguish the slits 192-1 and 192-2 from each other, the slits are simply referred to as a slit 192.

The slits 191-1 and 191-2 are slits which connect the hollow portion, that is, the inside of the opening 75 to the slit 77-1. Furthermore, the slits 192-1 and 192-2 are slits which connect the slits 77-1 and 77-2 to each other. In addition, the slit 193 is a slit which connects the slit 77-2 to the outside of the imaging element package 21.

Therefore, a part of the slits 191 and 77-1, a part of the slits 192 and 77-2, and the slit 193 form the ventilation path for connecting the hollow portion to the outside.

Therefore, for example, when heat is applied to the imaging element package 21 and air in the hollow portion expands, a part of the air in the hollow portion can be escaped to the outside via the ventilation path formed by the plurality of slits such as the slit 191.

With this configuration, the increase in the internal pressure in the hollow portion can be prevented, and as a result, it is possible to prevent occurrence of the warpage of the imaging element package 21, breakage of the adhesive interface of the adhesive 76 between the transparent member 63 and the flexible substrate 62, and breakage of a flip-chip connection portion of the imaging element 61. In other words, it is possible to reduce a risk of the warpage and the breakage, and reliability of the imaging element package 21, that is, a camera module 11 can be improved.

Note that, when the ventilation path to prevent the increase in the internal pressure is formed, it is desirable to provide only one end on the outer side of the ventilation path.

In the example in FIG. 8, only the slit 193 connects the slit 77-2 to the outside of the flexible substrate 62 (imaging element package 21). In other words, an end of the slit 193 on the side opposite to the slit 77-2 is only an end of the ventilation path on the side of the outside to prevent the increase in the internal pressure. On the other hand, any number of ends of the ventilation path on the side of the hollow portion may be provided. In this example, the ends of the two slits 191 are respectively the ends of the ventilation path on the side of the hollow portion.

By forming only one end of the ventilation path on the side of the outside, for example, at the time of cleaning in the manufacturing process of the imaging element package 21, or the like, it is possible to prevent entrance of liquid such as water from the outside to the hollow portion and to improve the reliability. Specifically, for example, even when water enters the inside of the slit 193 at the time of cleaning, the internal pressure of the hollow portion becomes constant immediately after the entrance of water. Therefore, the water entered from the slit 193 does not reach the hollow portion.

Furthermore, in the example in FIG. 8, since the two slits 77-1 and 77-2 surrounding the light receiving unit 71 with no gap are provided, the slit 192 to connect between the slits 77 is provided. However, in a case where only one slit 77 is provided, it is not necessary to provide the slit 192.

<Exemplary Usage of Solid-State Imaging Device>

Figure 9:
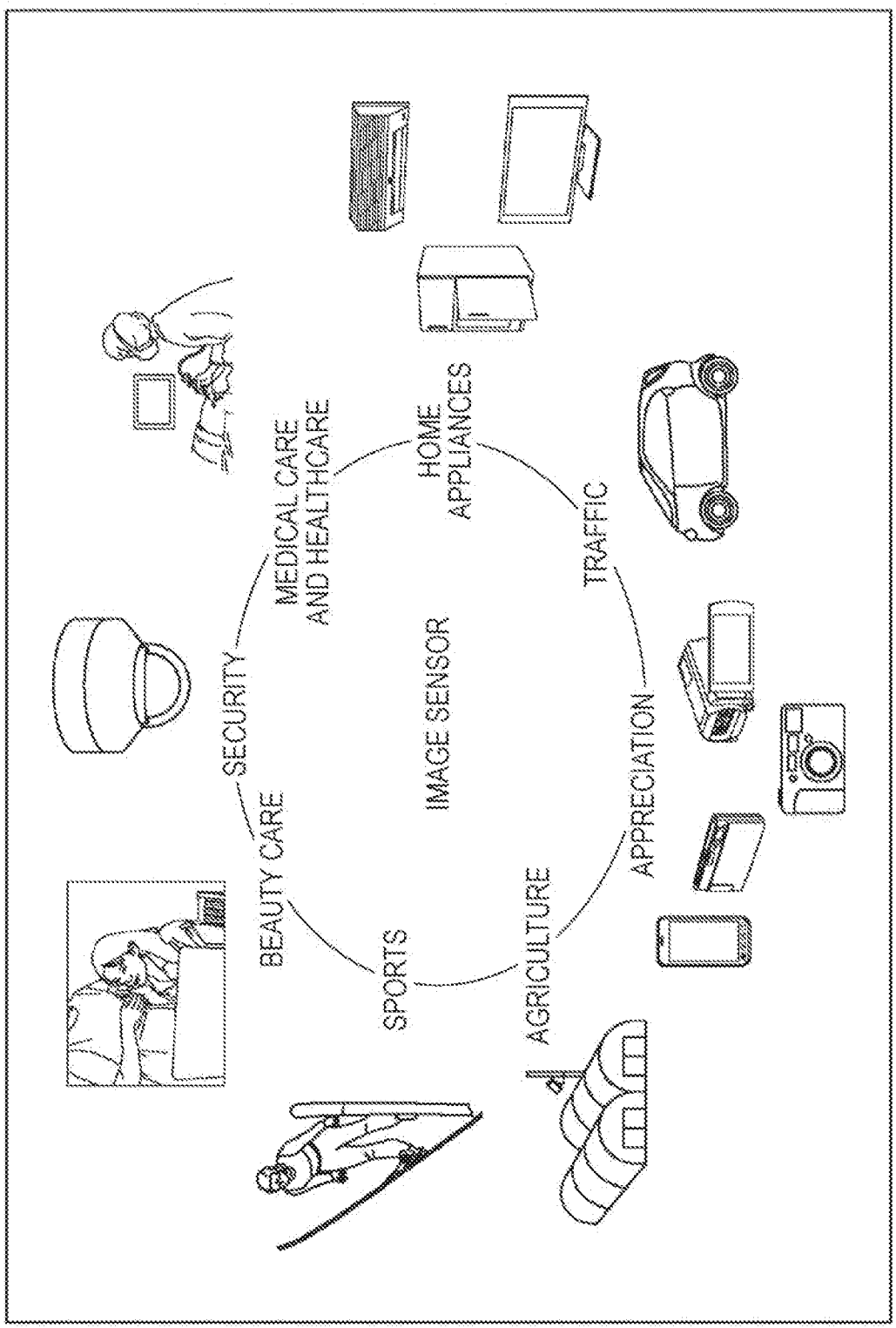
FIG. 9 is a diagram of an exemplary usage of a solid-state imaging device.

FIG. 9 is a diagram of an exemplary usage of the solid-state imaging device (image sensor) described above, that is, the imaging element 61.

The solid-state imaging device described above can be used, for example, in various cases in which light such as visible light, infrared light, ultraviolet light, and X-rays are sensed as follows.

- A device which images an image to be used for appreciation, such as a digital camera and a portable device with a camera function
- A device which is used for traffic, such as an in-vehicle sensor for imaging the front, rear, surroundings, inside, and the like of a car for safe driving such as automatic stop, recognition of a driver's state, and the like, a monitoring camera for monitoring a traveling vehicle and a road, a distance measuring sensor for measuring a distance between vehicles, and the like
- A device which is used for home appliances, such as a TV, a refrigerator, an air conditioner to image a gesture of a user and operates the device according to the gesture
- A device which is used for medical care and healthcare, such as an endoscope and a device for performing angiography by receiving infrared light
- A device which is used for security, such as a security monitoring camera and a camera for person authentication
- A device which is used for beauty care, such as a skin measuring instrument for photographing skin and a microscope for photographing a scalp
- A device which is used for sports, such as an action camera, a wearable camera for sports, and the like
- A device which is used for agriculture, such as a camera for monitoring conditions of fields and crops <Application to Mobile Body>

The technology according to the present disclosure (present technology) can be applied to various products. For example, the technology according to the present disclosure may be realized as an apparatus to be mounted on any type of mobile body such as a car, an electric vehicle, a hybrid electric vehicle, a motorcycle, a bicycle, a personal mobility, an airplane, a drone, a ship, and a robot.

Figure 10:
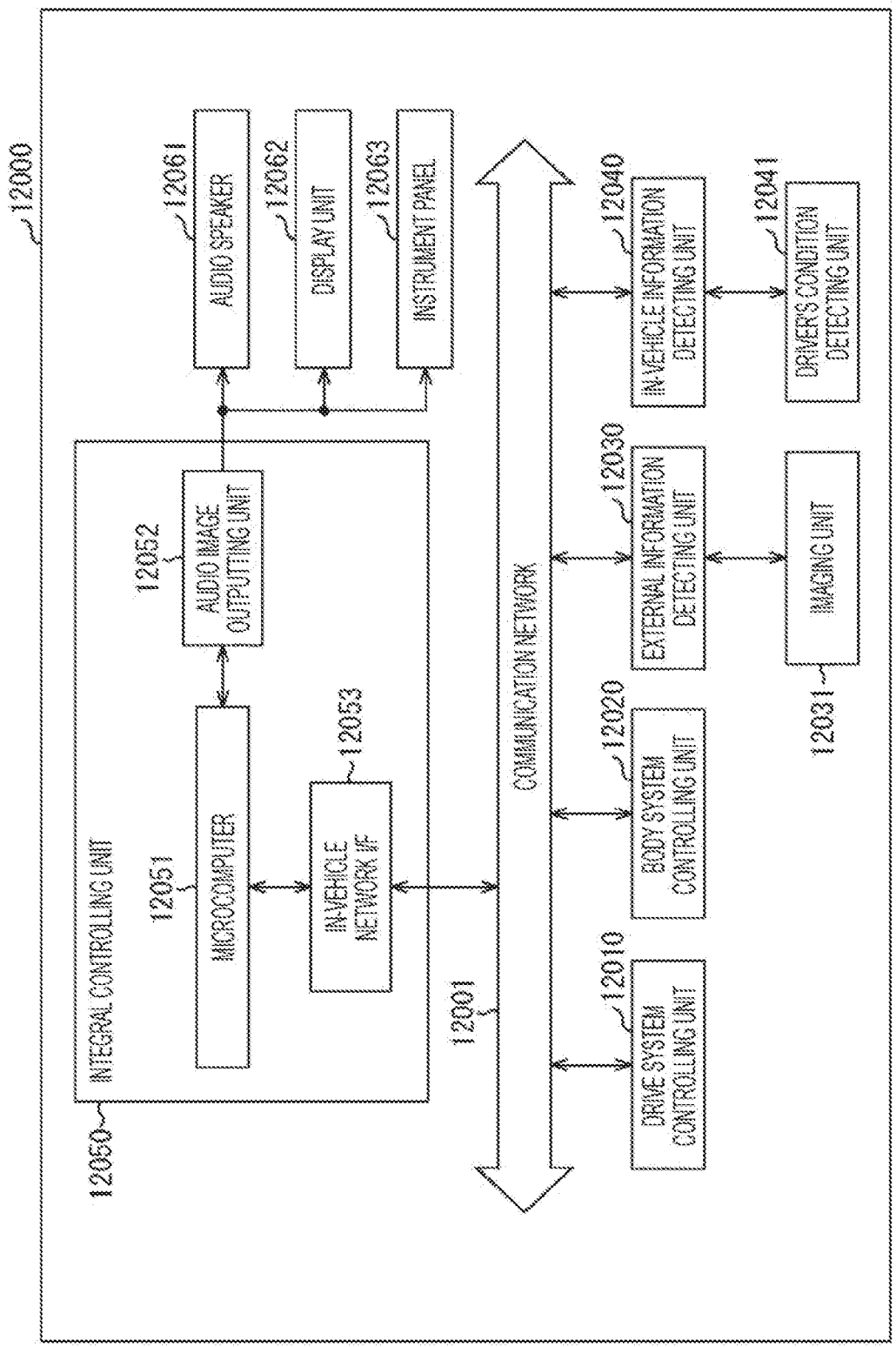
FIG. 10 is a block diagram of an exemplary schematic configuration of a vehicle control system.

FIG. 10 is a block diagram of an exemplary schematic configuration of a vehicle control system which is an example of a mobile body control system to which the technology according to the present disclosure may be applied.

A vehicle control system 12000 includes a plurality of electronic control units connected via a communication network 12001. In the example illustrated in FIG. 10, the vehicle control system 12000 includes a drive system controlling unit 12010, a body system controlling unit 12020, an external information detecting unit 12030, an in-vehicle information detecting unit 12040, and an integral controlling unit 12050. Furthermore, as a functional configuration of the integral controlling unit 12050, a microcomputer 12051, an audio image outputting unit 12052, and an in-vehicle network interface (I/F) 12053 are illustrated.

The drive system controlling unit 12010 controls an operation of a device relating to a driving system of the vehicle in accordance with various programs. For example, the drive system controlling unit 12010 functions as a control device of a device such as a driving force generating device to generate a driving force of the vehicle such as an internal combustion engine or a driving motor, a driving force transmitting mechanism to transmit the driving force to wheels, a steering mechanism which adjusts a steering angle of the vehicle, and a braking device which generates a braking force of the vehicle.

The body system controlling unit 12020 controls operations of various devices attached to the vehicle body in accordance with various programs. For example, the body system controlling unit 12020 functions as a control device of a keyless entry system, a smart key system, a power window device, or various lamps such as a headlamp, a back lamp, a brake lamp, a direction indicator, or a fog lamp. In this case, a radio wave transmitted from a portable machine for substituting a key or signals of various switches may be input to the body system controlling unit 12020. The body system controlling unit 12020 receives the input of the radio wave or the signal and controls a door locking device, the power window device, the lamp, and the like of the vehicle.

The external information detecting unit 12030 detects external information of the vehicle including the vehicle control system 12000. For example, the external information detecting unit 12030 is connected to an imaging unit 12031. The external information detecting unit 12030 makes the imaging unit 12031 image an image outside the vehicle and receives the imaged image. The external information detecting unit 12030 may perform processing of detecting an object such as a human, a car, an obstacle, a sign, or letters on the road or distance detection processing on the basis of the received image.

The imaging unit 12031 is an optical sensor which receives light and outputs an electric signal according to an amount of the received light. The imaging unit 12031 can output the electric signal as an image or output the electric signal as information for distance measurement. Furthermore, the light received by the imaging unit 12031 may be visible light or invisible light such as infrared light.

The in-vehicle information detecting unit 12040 detects in-vehicle information. The in-vehicle information detecting unit 12040 is connected to, for example, a driver's condition detecting unit 12041 for detecting a condition of a driver. The driver's condition detecting unit 12041 includes, for example, a camera which images the driver. On the basis of the detection information input by the driver's condition detecting unit 12041, the in-vehicle information detecting unit 12040 may calculate a fatigue degree or a concentration degree of the driver and may determine whether the driver falls asleep.

The microcomputer 12051 can calculate a control target value of the driving force generating device, the steering mechanism, or the braking device on the basis of information inside and outside the vehicle obtained by the external information detecting unit 12030 or the in-vehicle information detecting unit 12040 and can output a control instruction to the drive system controlling unit 12010. For example, the microcomputer 12051 can perform cooperative control to realize a function of an Advanced Driver Assistance System (ADAS) including collision avoidance or impact relaxation of the vehicle, a following travel on the basis of a distance between vehicles, a vehicle speed maintaining travel, a vehicle collision warning, a lane deviation warning of the vehicle, or the like.

In addition, the microcomputer 12051 controls the driving force generating device, the steering mechanism, the braking device, or the like on the basis of the information regarding the surroundings of the vehicle obtained by the external information detecting unit 12030 or the in-vehicle information detecting unit 12040 so as to perform cooperative control for automatic drive in which the vehicle autonomously travels without depending on an operation by the driver and the like.

In addition, the microcomputer 12051 can output the control instruction to the body system controlling unit 12020 on the basis of the information of the outside of the vehicle obtained by the external information detecting unit 12030. For example, the microcomputer 12051 controls the headlamps according to a position of a preceding vehicle or an oncoming vehicle detected by the external information detecting unit 12030 so as to perform cooperative control to prevent a glare such as switching a high beam to a low beam.

The audio image outputting unit 12052 transmits an output signal which is at least one of a voice or an image to an output device which can visually or auditorily notify information of the occupant of the vehicle or the outside the vehicle. In the example in FIG. 10, an audio speaker 12061, a display unit 12062, and an instrument panel 12063 are exemplified as the output devices. The display unit 12062 may include, for example, at least one of an on-board display or a head-up display.

Figure 11:
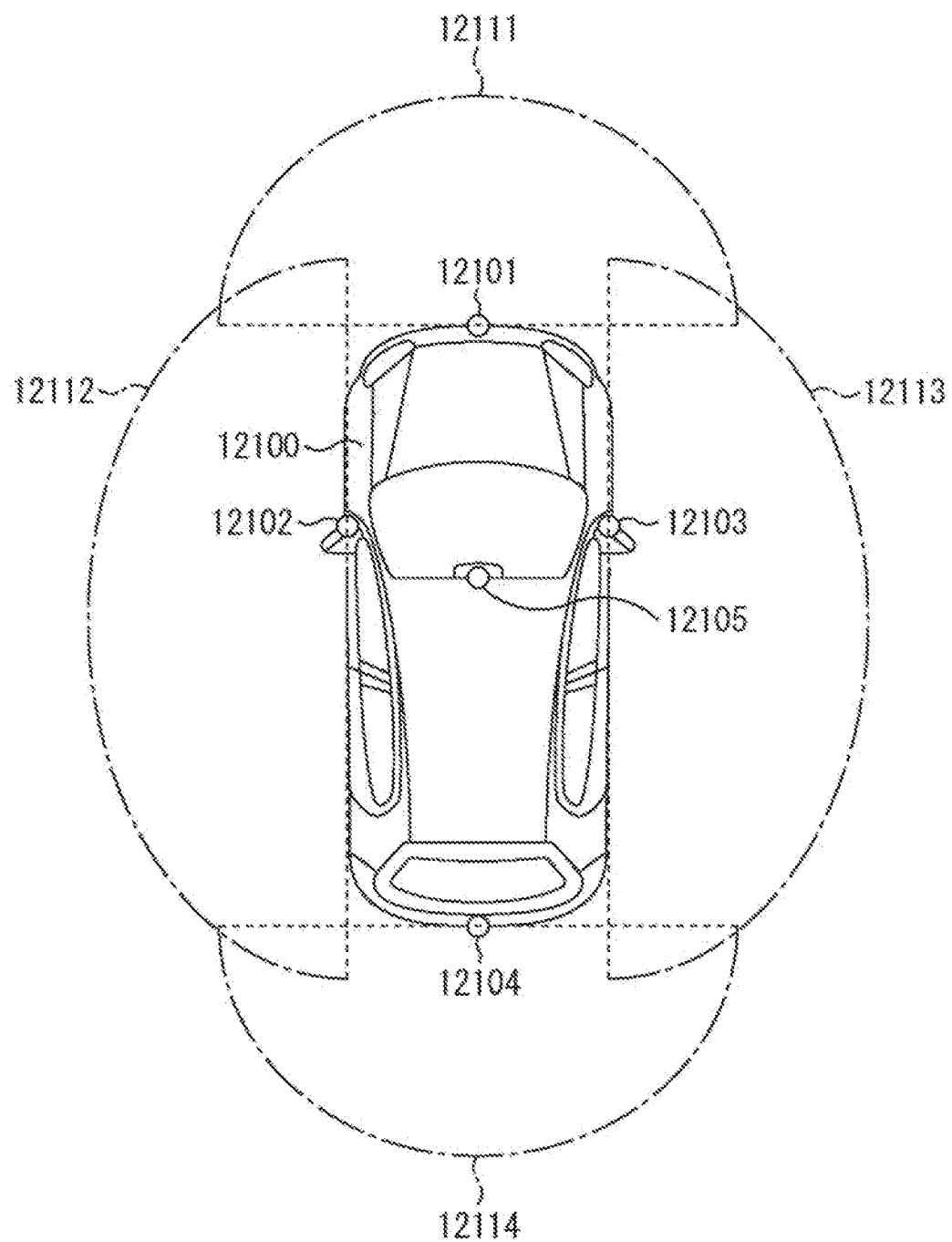
FIG. 11 is an explanatory diagram of exemplary installation positions of imaging units.

FIG. 11 is a diagram of exemplary installation positions of the imaging units 12031.

In FIG. 11, the imaging unit 12031 includes imaging units 12101, 12102, 12103, 12104, and 12105.

Each of the imaging units 12101, 12102, 12103, 12104, and 12105 are provided in one of, for example, a front nose, a side mirror, a rear bumper, a back door, an upper side of a windshield in a vehicle interior of a vehicle 12100, and the like. The imaging unit 12101 provided in the front nose and the imaging unit 12105 provided on the upper side of the windshield in the vehicle interior mainly obtain images on front side of the vehicle 12100. The imaging units 12102 and 12103 provided in the side mirrors mainly obtain images on the sides of the vehicle 12100. The imaging unit 12104 provided in the rear bumper or the back door mainly obtains an image on the back side of the vehicle 12100. The imaging unit 12105 provided on the upper side of the windshield in the vehicle interior is mainly used to detect a preceding vehicle, a pedestrian, an obstacle, a traffic light, a traffic sign, a traffic lane, or the like.

It should be noted that, in FIG. 11, exemplary imaging ranges of the imaging units 12101 to 12104 are illustrated. An imaging range 12111 indicates an imaging range of the imaging unit 12101 provided in the front nose, and imaging ranges 12112 and 12113 respectively indicate imaging ranges of the imaging units 12102 and 12103 provided in the side mirrors. An imaging range 12114 indicates an imaging range of the imaging unit 12104 provided in the rear bumper or the back door. For example, image data imaged by the imaging units 12101 to 12104 is superposed so that a bird's-eye image of the vehicle 12100 viewed from above can be obtained.

At least one of the imaging units 12101 to 12104 may have a function of obtaining distance information. For example, at least one of the imaging units 12101 to 12104 may be a stereo camera including a plurality of imaging elements or may be an imaging element having pixels to detect a phase difference.

For example, by obtaining a distance to solid objects in the respective imaging ranges 12111 to 12114 and a temporal change of the distance (relative speed to vehicle 12100) on the basis of the distance information obtained from the imaging units 12101 to 12104, the microcomputer 12051 can extract a solid object which is positioned on a traveling route of the vehicle 12100 and positioned closest to the vehicle 12100 and travels at a predetermined speed (for example, equal to or more than zero km/h) in a direction substantially the same as the direction in which the vehicle 12100 travels, as a preceding vehicle. In addition, the microcomputer 12051 can set a distance between the vehicles which should be previously secured in front of the preceding vehicle and perform automatic brake control (including following travel stop control), automatic acceleration control (including following travel start control), and the like. In this way, the cooperative control can be performed for automatic drive and the like in which the vehicle autonomously travels without depending on the operation by the driver.

For example, on the basis of the distance information obtained from the imaging units 12101 to 12104, the microcomputer 12051 can classify solid object data regarding the solid object into a two-wheeled vehicle, a regular vehicle, a large vehicle, a pedestrian, a utility pole, and other solid object and extract the data so as to use the extracted data to automatically avoid an obstacle. For example, the microcomputer 12051 identifies an obstacle around the vehicle 12100 into an obstacle which can be visually recognized by the driver of the vehicle 12100 and an obstacle which is hard to be visually recognized by the driver. Then, the microcomputer 12051 determines a collision risk indicating a danger of risk of the collision with each obstacle. When the collision risk is equal to or higher than a predetermined value and the vehicle may collide the obstacle, the microcomputer 12051 can assist driving to avoid collision by outputting a warning to the driver via the audio speaker 12061 and the display unit 12062 or by forcing deceleration or steering to avoid the obstacle via the drive system controlling unit 12010.

At least one of the imaging units 12101 to 12104 may be an infrared camera for detecting infrared light. For example, the microcomputer 12051 can recognize a pedestrian by determining whether or not the pedestrian exists in the imaged images of the imaging units 12101 to 12104. The pedestrian is recognized, for example, by a procedure of extracting feature points in the imaged images of the imaging units 12101 to 12104 as the infrared cameras and a procedure of performing pattern matching processing on the series of feature points indicating the shape of the object to determine whether or not the object is a pedestrian. When the microcomputer 12051 determines that the pedestrian exists in the imaged images of the imaging units 12101 to 12104 and recognizes the pedestrian, the audio image outputting unit 12052 controls the display unit 12062 to display superimposed rectangular outlines to emphasize the recognized pedestrian. Furthermore, the audio image outputting unit 12052 may control the display unit 12062 to display an icon and the like indicating the pedestrian at a desired position.

An example of the vehicle control system to which the technology according to the present disclosure may be applied has been described above. The technology according to the present disclosure may be applied to the imaging unit 12031 in the above configuration. By applying the technology according to the present disclosure to the imaging unit 12031, the reliability can be improved.

Furthermore, the embodiment of the present technology is not limited to the above-mentioned embodiments, and various changes can be made without departing from the scope of the present technology.

In addition, the present technology can have the following configurations.

(1)

An imaging element package including:

a flexible substrate;

an imaging element connected to a first surface of the flexible substrate; and a member, bonded to a second surface of the flexible substrate opposite to the first surface with an adhesive, having a linear expansion coefficient different from the flexible substrate, in which in a portion of the adhesive, a slit is formed which intersects with a direction from the imaging element toward an end of the flexible substrate as viewed from a direction perpendicular to the flexible substrate.

(2)

The imaging element package according to (1), in which the slit is formed so that a width of the slit is wider than a thickness of the flexible substrate.

(3)

The imaging element package according to (1) or (2), in which the slit is formed in a region different from a region where a connection portion between the flexible substrate and the imaging element is provided as viewed from the direction perpendicular to the flexible substrate.

(4)

The imaging element package according to any one of (1) to (3), in which the slit is formed in a region different from a region on the first surface in which an external terminal is provided as viewed from the direction perpendicular to the flexible substrate.

(5)

The imaging element package according to any one of (1) to (4), in which the one or the plurality of slits is formed in the portion of the adhesive, and the slit is formed so that an optional straight line from the imaging element toward the end of the flexible substrate intersects with at least one of the one or the plurality of slits as viewed from the direction perpendicular to the flexible substrate.

(6)

The imaging element package according to any one of (1) to (5), in which the one or the plurality of slits surrounding a light receiving unit of the imaging element with no gap is formed in the portion of the adhesive.

(7)

The imaging element package according to any one of (1) to (5), in which the slit is formed in the portion of the adhesive so that the plurality of slits surrounds a light receiving unit of the imaging element.

(8)

The imaging element package according to any one of (1) to (7), in which the imaging element is connected to the first surface so that the light receiving unit faces the member, an opening is provided in a portion of the flexible substrate facing the light receiving unit, and the member includes a transparent member.

(9)

The imaging element package according to any one of (1) to (8), in which a connection portion between the imaging element and the flexible substrate is coated with resin.

(10)

The imaging element package according to any one of (1) to (9), in which a hollow portion is provided between the light receiving unit of the imaging element and the member, and the one or the plurality of slits including the slit forms a ventilation path for connecting the hollow portion to an outside.

(11)

The imaging element package according to (10), in which only one end of the ventilation path on a side of the outside is provided.

(12)

A camera module including:

a flexible substrate;

an imaging element connected to a first surface of the flexible substrate;

a member, bonded to a second surface of the flexible substrate opposite to the first surface with an adhesive, having a linear expansion coefficient different from the flexible substrate;

a lens configured to guide light entered from outside to the imaging element via the member and an opening of the flexible substrate; and a substrate connected to the first surface of the flexible substrate, in which in a portion of the adhesive, a slit is formed which intersects with a direction from the imaging element toward an end of the flexible substrate as viewed from a direction perpendicular to the flexible substrate.

REFERENCE SIGNS LIST

11 Camera module
21 Imaging element package
23 Optical lens
25 Substrate
61 Imaging element
62 Flexible substrate
63 Transparent member
76 Adhesive
77-1, 77-2, 77 Slit

The invention claimed is:

1. An imaging element package, comprising:
a flexible substrate;
an imaging element connected to a first surface of the flexible substrate; and
a member, bonded to a second surface of the flexible substrate opposite to the first surface with an adhesive, having a linear expansion coefficient different from the flexible substrate, wherein
in a portion of the adhesive, a slit is formed which intersects with a direction from the imaging element toward an end of the flexible substrate as viewed from a direction perpendicular to the flexible substrate.

2. The imaging element package according to claim 1, wherein
the slit is formed so that a width of the slit is wider than a thickness of the flexible substrate.

3. The imaging element package according to claim 1, wherein
the slit is formed in a region different from a region where a connection portion between the flexible substrate and the imaging element is provided as viewed from the direction perpendicular to the flexible substrate.

4. The imaging element package according to claim 1, wherein
the slit is formed in a region different from a region on the first surface in which an external terminal is provided as viewed from the direction perpendicular to the flexible substrate.

5. The imaging element package according to claim 1, wherein
one slit or a plurality of slits is formed in the portion of the adhesive, and
the slit is formed so that an optional straight line from the imaging element toward the end of the flexible substrate intersects with at least one of the one slit or the plurality of slits as viewed from the direction perpendicular to the flexible substrate.

6. The imaging element package according to claim 1, wherein
one slit or a plurality of slits surrounding a light receiving unit of the imaging element with no gap is formed in the portion of the adhesive.

7. The imaging element package according to claim 1, wherein
the slit is formed in the portion of the adhesive so that a plurality of slits surrounds a light receiving unit of the imaging element.

8. The imaging element package according to claim 1, wherein
the imaging element is connected to the first surface so that a light receiving unit faces the member,
an opening is provided in a portion of the flexible substrate facing the light receiving unit, and
the member includes a transparent member.

9. The imaging element package according to claim 1, wherein
a connection portion between the imaging element and the flexible substrate is coated with resin.

10. The imaging element package according to claim 1, wherein
a hollow portion is provided between a light receiving unit of the imaging element and the member, and
one slit or a plurality of slits including the slit forms a ventilation path for connecting the hollow portion to an outside.

11. The imaging element package according to claim 10, wherein
only one end of the ventilation path on a side of the outside is provided.

12. A camera module, comprising:
a flexible substrate;
an imaging element connected to a first surface of the flexible substrate;
a member, bonded to a second surface of the flexible substrate opposite to the first surface with an adhesive, having a linear expansion coefficient different from the flexible substrate;
a lens configured to guide light entered from outside to the imaging element via the member and an opening of the flexible substrate; and
a substrate connected to the first surface of the flexible substrate, wherein
in a portion of the adhesive, a slit is formed which intersects with a direction from the imaging element toward an end of the flexible substrate as viewed from a direction perpendicular to the flexible substrate.

* * * * *